US009825648B1

(12) United States Patent
Gopal et al.

(10) Patent No.: US 9,825,648 B1
(45) Date of Patent: Nov. 21, 2017

(54) METHOD AND APPARATUS FOR HYBRID COMPRESSION PROCESSING FOR HIGH LEVELS OF COMPRESSION

(71) Applicant: Intel Corporation, Santa Clara, CA (US)

(72) Inventors: Vinodh Gopal, Westborough, MA (US); James D. Guilford, Northborough, MA (US); Daniel F. Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/277,119

(22) Filed: Sep. 27, 2016

(51) Int. Cl.
*H03M 7/34* (2006.01)
*H03M 7/30* (2006.01)
*G06F 3/06* (2006.01)

(52) U.S. Cl.
CPC .......... *H03M 7/3086* (2013.01); *G06F 3/061* (2013.01); *G06F 3/064* (2013.01); *G06F 3/0608* (2013.01); *G06F 3/0656* (2013.01); *G06F 3/0673* (2013.01)

(58) Field of Classification Search
CPC . H03M 7/3084; H03M 7/3086; G06F 3/0608; G06F 3/0673; G06F 3/064; G06F 3/0656; G06F 3/061
USPC ........................................ 341/51, 65, 67, 87
See application file for complete search history.

(56) References Cited

U.S. PATENT DOCUMENTS 9,363,339 B2 * 6/2016 Bhaskar .............. H03M 7/3088

OTHER PUBLICATIONS

"RFC1951—Deflate Compressed Data Format Specification version," Internet URL http://www.faqs.org/rfcs/rfc1951.html, Aug. 19, 2016, 15 pages.
Huffman, D. A., "A Method for the Construction of Minimum Redundancy Codes",Proceedings of the Institute of Radio Engineers, Sep. 1952, vol. 40, No. 9,pp. 1098-1101, 4 pages.
Ziv J., Lempel A., "A Universal Algorithm for Sequential Data Compression", IEEE Transactions on Information Theory, May 1977, vol. 23, No. 3, pp. 337-343, 7 pages.

* cited by examiner

Primary Examiner — Khai M Nguyen
(74) Attorney, Agent, or Firm — Patent Capital Group

(57) ABSTRACT

In one embodiment, an apparatus comprises a first compression engine to receive a first compressed data block from a second compression engine that is to generate the first compressed data block by compressing a first plurality of repeated instances of data that each have a length greater than or equal to a first length. The first compression engine is further to compress a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated. The apparatus further comprises a memory buffer to store the compressed first and second plurality of repeated instances of data.

20 Claims, 14 Drawing Sheets

502 — ABCDEABCFABCDEKABCDGHI

| SHORT PREFIXES 504 |
|---|
| ABCD |
| BCDE |
| CDEA |
| DEAB |
| EABC |
| ABCF |
| BCFA |
| CFAB |
| FABC |
| ABCD |
| BCDE |
| CDEK |
| DEKA |
| EKAB |
| KABC |
| ABCD |
| BCDG |
| CDGH |
| DGHI |

| HASH VALUES | LOCATIONS | | |
|---|---|---|---|
| $ABCD_H$ | 0 | 9 | 15 |
| $BCDE_H$ | 1 | 10 | |
| $CDEA_H$ | 2 | | |
| $DEAB_H$ | 3 | | |
| $EABC_H$ | 4 | | |
| $ABCF_H$ | 5 | | |
| $BCFA_H$ | 6 | | |
| $CFAB_H$ | 7 | | |
| $FABC_H$ | 8 | | |
| $CDEK_H$ | 11 | | |
| $DEKA_H$ | 12 | | |
| $EKAB_H$ | 13 | | |
| $KABC_H$ | 14 | | |
| $BCDG_H$ | 16 | | |
| $CDGH_H$ | 17 | | |
| $DGHI_H$ | 18 | | |

506

508

| | |
|---|---|
| LITERAL | LENGTH = 9 VAL=ABCDEABCF |
| MATCH | LENGTH = 5 DISTANCE = 9 |
| LITERAL | LENGTH = 1 VAL=K |
| MATCH | LENGTH = 4 DISTANCE = 6 |
| LITERAL | LENGTH = 3 VAL=GHI |
| MATCH | LENGTH = 0 |

ABCDEABCFABCDEKABCDGHI — 602

| SHORT PREFIXES | 604 |
|---|---|
| ABC | |
| BCD | |
| CDE | |
| DEA | |
| EAB | |
| ABC | |
| BCF | |
| CFA | |
| FAB | |
| ABC | |
| BCD | |
| CDE | |
| DEK | |
| EKA | |
| KAB | |
| ABC | |
| BCD | |
| CDG | |
| DGH | |
| GHI | |

606

| HASH VALUES | LOCATION |
|---|---|
| $ABC_H$ | 0 5 9 15 |
| $BCD_H$ | 1 10 16 |
| $CDE_H$ | 2 11 |
| $DEA_H$ | 3 |
| $EAB_H$ | 4 |
| $BCF_H$ | 6 |
| $CFA_H$ | 7 |
| $FAB_H$ | 8 |
| $DEK_H$ | 12 |
| $EKA_H$ | 13 |
| $KAB_H$ | 14 |
| $CDG_H$ | 17 |
| $DGH_H$ | 18 |
| $GHI_H$ | 19 |

608

| LITERAL | LENGTH = 5  VAL=ABCDE |
| MATCH | LENGTH = 3  DISTANCE = 5 |
| LITERAL | LENGTH = 1  VAL=F |
| MATCH | LENGTH = 5  DISTANCE = 9 |
| LITERAL | LENGTH = 1  VAL=K |
| MATCH | LENGTH = 4  DISTANCE = 6 |
| LITERAL | LENGTH = 3  VAL=GHI |
| MATCH | LENGTH = 0 |

610A, 610B, 610C, 610D

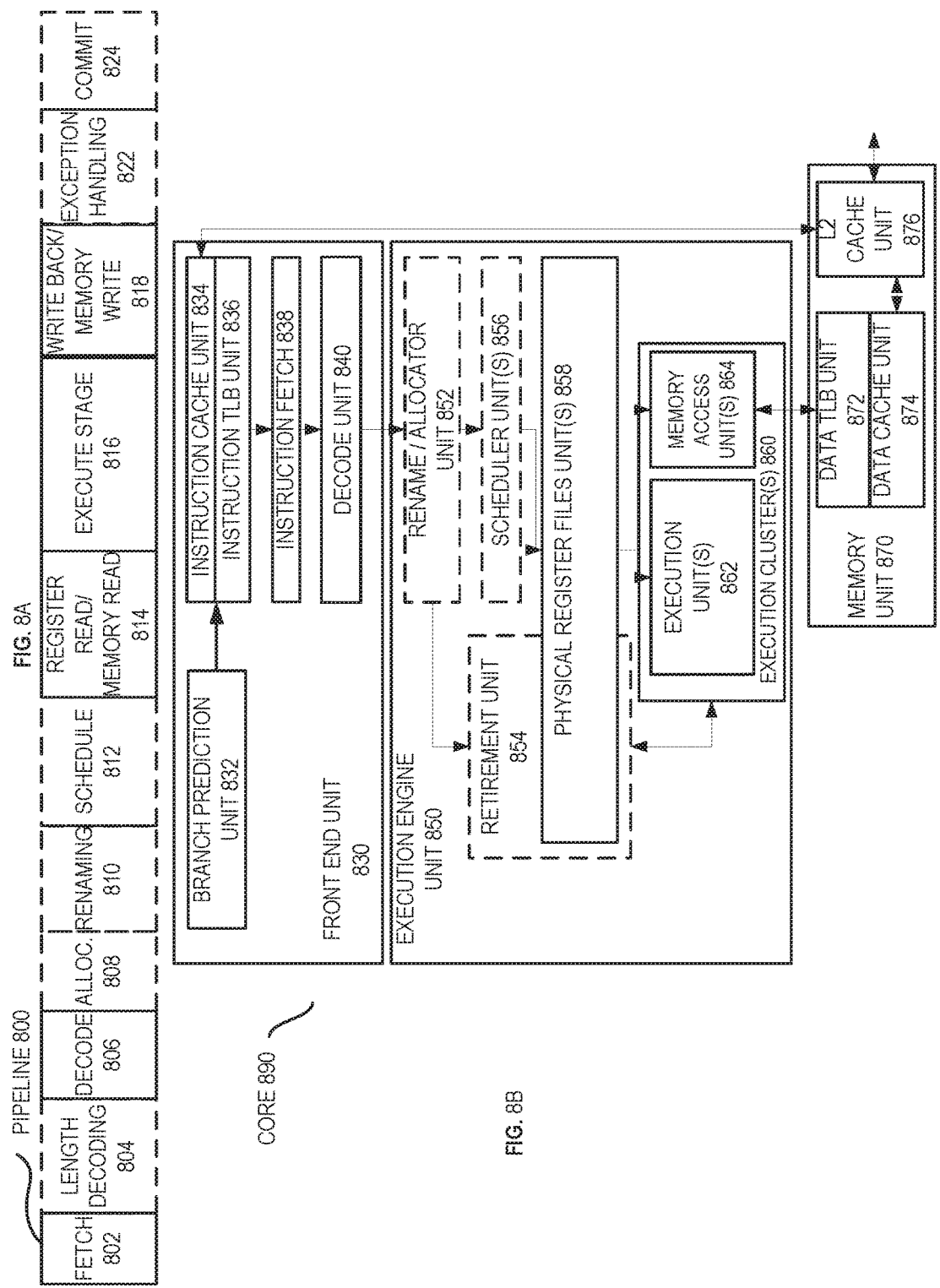

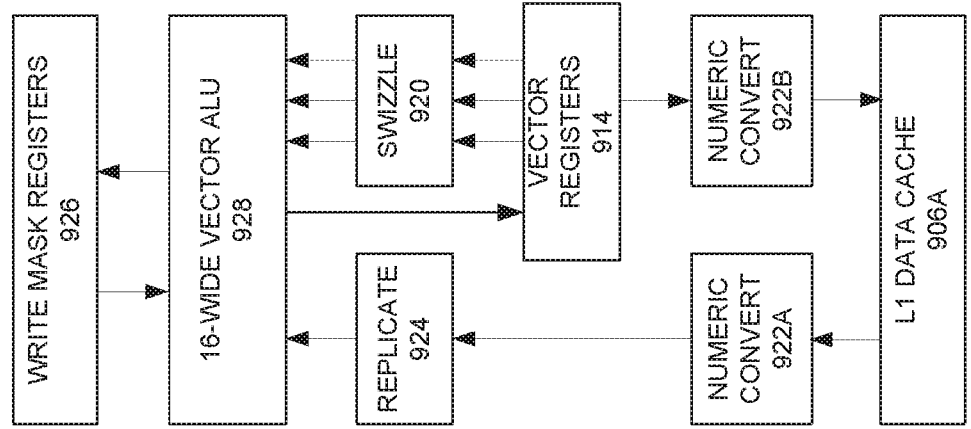
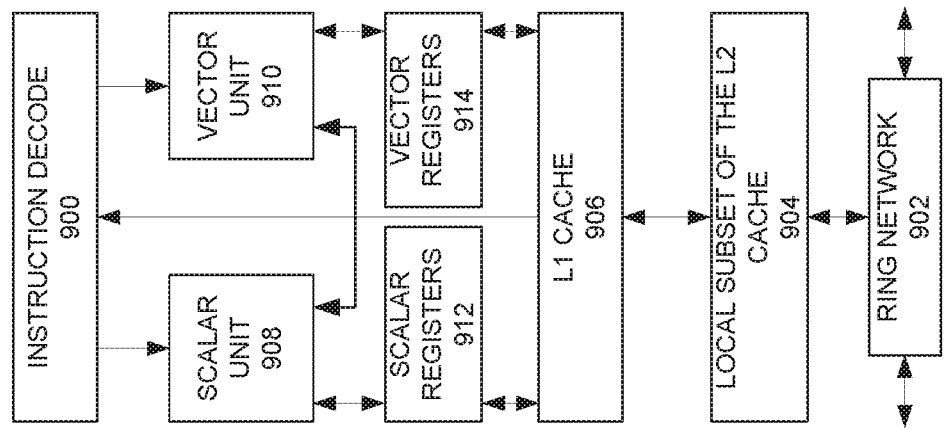

METHOD AND APPARATUS FOR HYBRID COMPRESSION PROCESSING FOR HIGH LEVELS OF COMPRESSION

FIELD

The present disclosure relates in general to the field of computer development, and more specifically, to data compression.

BACKGROUND

A computing system may include one or more processors, one or more memory devices, and one or more communication controllers, among other components. Logic of the computing device may be operable to access and compress a data set.

BRIEF DESCRIPTION OF THE DRAWINGS

FIG. 5 illustrates a first exemplary compressed data set in accordance with certain embodiments.

FIG. 6 illustrates a second exemplary compressed data set in accordance with certain embodiments.

FIG. 8A is a block diagram illustrating both an exemplary in-order pipeline and an exemplary register renaming, out-of-order issue/execution pipeline in accordance with certain embodiments.

FIG. 8B is a block diagram illustrating both an exemplary embodiment of an in-order architecture core and an exemplary register renaming, out-of-order issue/execution architecture core to be included in a processor in accordance with certain embodiments;

FIGS. 9A-B illustrate a block diagram of a more specific exemplary in-order core architecture, which core would be one of several logic blocks (potentially including other cores of the same type and/or different types) in a chip in accordance with certain embodiments;

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
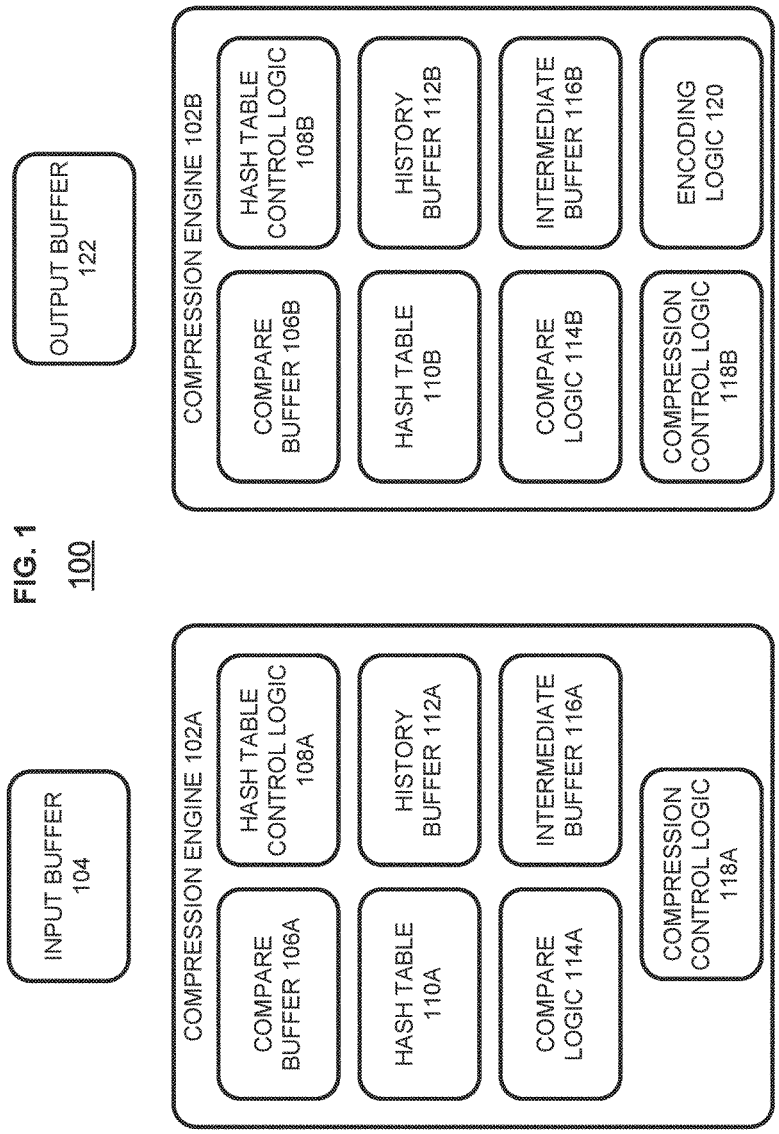
FIG. 1 illustrates a block diagram of components of a computer system in accordance with certain embodiments.

FIG. 1 illustrates a block diagram of components of a computer system 100 in accordance with certain embodiments. System 100 may include (among other components) compression engines 102, input buffer 104, and output buffer 122. During operation, any suitable component of computer system 100 may store a data set comprising a plurality of bytes (or other logical data groupings). In various systems, a data set may be stored in an uncompressed manner. However, such a method of storage may be expensive in terms of memory usage and bandwidth. Various embodiments of the present disclosure may provide techniques to efficiently compress any suitable types of data sets, such as data sets used in database applications, storage applications, networking applications, or other suitable applications.

Various embodiments of the present disclosure may improve the speed and compression ratios of various compression algorithms such as LZ77-based compression algorithms, including DEFLATE, LZO, LZS, LZF, LZ4, SNAPPY, and other compression algorithms. An LZ77-based algorithm identifies repeated data sequences and replaces them with backward references (having relative distance offsets) to previous instances of the same data sequences. The compressed data output by an LZ77-based algorithm includes a series of elements of two types: literals (data sequences for which previous instances were not found) and matches that include a length attribute and a position attribute (that refer back to a previous instance of a matching data sequence).

LZ77-based compression algorithms seek to find good data sequence matches at each position of a data set. The compression process typically searches a large number of locations and determines the longest match and/or other suitable match (in some algorithms in order to save time a "good enough" match length may be defined). The speed of a compression algorithm (whether implemented in hardware and/or software) is generally limited by the number of comparisons performed at each position of the data set, which may be closely related to the number of data sequences in a history buffer that have the same short prefix as the target data sequence at the current position. The short prefix at the current position may be hashed and the result may be used to identify other data sequences having the same hash value (which are then compared against the short prefix to determine whether a match exists). The length of the short prefix (i.e., the data that is hashed and forms at least a portion of data compared against possible matches) is typically set to the minimum length match of the particular algorithm (i.e., the minimum length for matches that will be encoded by match length and position attributes). As one example, the minimum length match for the DEFLATE compression algorithm is three bytes. Such implementations may result in possible matches in the history buffer not being missed, but short prefix lengths tend to make the resulting hash chains (i.e., the set of locations associated with a particular hash value that store potentially matching data sequences) very long, causing a significant increase in compression processing times. Increasing the length of the short prefix that is hashed will speed up processing (since the hash chains will be shorter), but will result in a severe loss of compression, since all or most matches shorter than the minimum length will not be found (and many matches in typical compressed streams tend to be of minimum size).

Various embodiments propose a hybrid compression scheme comprising a first compression engine that compresses an input data set by encoding matches having a first minimum length and placing the remaining uncompressed data sequences (i.e., literal sequences) into an intermediate data set with the encoded matches and a second compression engine that further compresses the intermediate data set by encoding matches having a second minimum length (which is shorter than the first minimum length) found in the uncompressed data sequences of the intermediate data set. In various embodiments, the second compression engine may then encode the resulting data set further (e.g., using Huffman encoding). In various embodiments, the second compression engine does a quick search for matches of the second length, comparing the short prefix against a maximum of one data sequence in the history buffer. In various embodiments, the first compression engine may be a hardware accelerator that accepts offloaded processing tasks from a CPU, while the second compression engine may be a CPU. In a particular embodiment, the first minimum length is four and the second minimum length is three.

Various embodiments of the present disclosure may provide technical advantages, such as reducing the amount of storage used to store a compressed data set, reducing the bandwidth used to transfer compressed data, increasing the speed of data compression, increasing the ratio of data compression, and other technical advantages.

In the embodiment depicted, compression engines 102A and 102B each include a compare buffer 106, hash table control logic 108, hash table 110, history buffer 112, compare logic 114, intermediate buffer 116, and compression control logic 118. In addition, compression engine 102B includes encoding logic 120. In other embodiments, the first and/or second compression engine may include other components or may omit any of the depicted components. The first and second compression engines may include any suitable set of components for performing the functions described herein. Components that appear in both compression engines are described collectively below, but should be understand to interact with other components from their respective compression engine, unless otherwise noted.

Input buffer 104 may include any suitable memory (including any of the types of memories referred to herein or other types of memories) for storing an input data set that is to be compressed. In various embodiments, input buffer 104 may be located within compression engine 102A or outside of compression engine 102A.

Compare buffer 106A may store data from the input buffer 104 and compare buffer 106B may store data from the intermediate buffer 116A of compression engine 102A (or other memory that holds a compressed data set output by compression engine 102A or the original input data set). In a particular embodiment, at various points in time, each compare buffer may store a short prefix of data (which in various embodiments is equal to the minimum match length compressed by the respective compression engine 102) as well as a data sequence immediately following the short prefix. The short prefix stored by compare buffer 106A is hashed and compared (along with the data sequence following the short prefix) against potential matches. In various embodiments, the length of a short prefix used by compression engine 102A is larger than the length of a short prefix used by compression engine 102B. In a particular embodiment, the short prefix of compression engine 102A is one byte larger than the short prefix of compression engine 102B. As one example, compare buffer 106A may store a short prefix that is 4 bytes long and compare buffer 106B may store a short prefix that is 3 bytes long. As another example, compare buffer 106A may store a short prefix that is 5 bytes long and compare buffer 106B may store a short prefix that is 4 bytes long. In other embodiments, the short prefix of compression engine 102A may be more than one byte larger than the short prefix of compression engine 102B. In various embodiments, the size of the short prefixes may be dynamically configurable based on the compression algorithm being performed.

The data stored in a compare buffer 106 may change as various positions in the input data set are checked for matches. In a particular embodiment, the compare buffer data advances by one byte (or other data amount) for each set of operations performed by a compression engine (where a set of operations could include hashing the compare buffer data, checking for one or more matches, and/or updating the respective hash table). Thus, when the compare buffer data is updated, the oldest byte (or other data amount) of the compare buffer data may be removed from the compare buffer and a new byte (or other data amount) from the respective input buffer (e.g., input buffer 104 for compare buffer 106A or intermediate buffer 116A for compare buffer 106B) may be added to the end of the compare buffer. Other methods for advancing through the input data is also contemplated by this disclosure. In various embodiments, a separate compare buffer 106 is not used and the short prefix and/or the data sequence following the short prefix is accessed directly (e.g., by hash table control logic 108 or compare logic 114) from another buffer (e.g., input buffer 104 or intermediate buffer 116A). Thus, when data from the compare buffer 106 is referred to herein, such data may also refer to similar data from any other suitable buffer (e.g., input buffer 104, intermediate buffer 116A, or other suitable buffer) in various embodiments.

Hash table control logic 108 includes logic to perform hashes on the short prefix stored in the compare buffer 106, access entries of hash table 110, add entries to or delete entries from hash table 110, and/or perform other operations associated with hash table 110. Logic 108 may implement any suitable hash function. Typically, the hash value output by the hash function will be shorter than the input to the hash function (i.e., the short prefix). In particular embodiments, this may result in aliasing where the hash function may output the same hash value for multiple different input values (this is resolved by comparing the short prefix along with subsequent data against one or more data sequences at locations associated with the hash value to determine whether the short prefix and subsequent data match the data sequences).

Hash table 110 may be implemented using any type of memory elements (including those described herein or other memory elements) and using any suitable data structure providing associations between hash values and pointers (where each pointer provides an indication of a location of a data sequence). Each hash value of hash table 110 may be associated with any number of pointers that point to locations of data sequences that produced the same hash value). For example, a hash value may be an index to a portion of a table or other data structure, where the portion includes one or more pointers associated with that hash value. In a particular embodiment, each hash value used to access hash table 110A may be associated with any number of pointers but each hash value used to access hash table 110B may be associated with a maximum of one pointer (and/or only one pointer is accessed when the hash of the current short prefix matches that particular hash value). In such an embodiment, compression engine 102B may be configured to do a quick compare of its short prefix (and subsequent data) (by comparing it against a maximum of one data sequence indicated by a pointer of hash table 110B) while compression engine 102A may be configured to do a more thorough compare of its short prefix (and subsequent data) to one or more data sequences at various locations indicated by multiple pointers of hash table 110A. In other embodiments, each hash value of hash table 110B may be associated with a maximum of two pointers or three pointers, or other limited number of pointers and/or the compression engine 102B is configured to do a comparison on a maximum of two or three data sequences associated with the hash value obtained from the current short prefix. Such embodiments may provide particular speed advantages when the first compression engine is implemented in hardware (e.g., via a hardware accelerator) and the second compression engine is implemented in software (e.g., via a processor executing software instructions) or in other embodiments.

In various embodiments, the pointers of the hash table 110 may refer to data stored in a history buffer 112. Data that has cycled through the compare buffer 106 may be placed in history buffer 112 (in various embodiments the data could be received from the compare buffer 106 or other suitable buffer such as input buffer 104). Thus, the data stored by history buffer 112 may represent at least a portion of the input data set (which in various embodiments would be the data initially stored in input buffer 104). In various embodiments, the data stored in the history buffer is shorter than the entire data set, thus the history buffer 112 may store the most recent data (i.e., the data that was most recently hashed and/or analyzed for matches). In other embodiments, the pointers of the hash table 110 may refer to any other suitable location of data sequences (e.g., locations in the input buffer 104, intermediate buffer 116A, or other suitable buffer). The pointers may have any suitable format. For example, the pointers may store an absolute address or a relative address (e.g., with respect to a current location of the input data set) of a location.

In various embodiments, the maximum number of pointers associated with a hash value and/or the maximum number of pointers that may be accessed by a compression engine 102 when looking for a match for a particular short prefix is reconfigurable (e.g., based on the level of compression selected by a user). In various embodiments, a compression engine 102 may be configured to stop looking for a match when a "good enough" match has been found (even if all of the pointers associated with the current hash value have not yet been accessed or if the maximum number of pointers allowed to be searched have not yet been accessed).

Compare logic 114 is operable to compare the short prefix (and subsequent data) against one or more data sequences (e.g., the locations of which may be indicated by one or more pointers associated with the hash value of the short prefix in the hash table 110). In a particular embodiment, the data sequences compared against the short prefix (and subsequent data) are obtained from the history buffer 112 (though they may be obtained from any suitable memory location). In addition to comparing the short prefix against one or more data sequences, the compare logic 114 may compare bytes (or other data amounts) immediately following the short prefix against bytes immediately following the data sequences indicated by the pointers of the hash table 110 to determine whether the match is longer than the length of the short prefix. In a particular embodiment, a comparison may involve comparing a data sequence from the input data set that begins with the short prefix (e.g., the data currently stored in compare buffer 106) against a data sequence at a location indicated by a pointer of the hash table 110 (e.g., a similarly sized amount of data from history buffer 112) and determining the length of the match based on this comparison. For example, if the compare buffer stored 256 bytes of data starting with a short prefix of 3 bytes, the short prefix and the next 253 bytes in the compare buffer could be simultaneously compared against 256 bytes of the history buffer 112 (or other suitable buffer) in order to determine how many consecutive bytes (starting with the first byte of the short prefix) match.

Intermediate buffer 116A may store data compressed by compression engine 102A and intermediate buffer 116B may store data compressed by compression engine 102B. Intermediate buffers 116A and 116B may be implemented using any type of memory elements (including those described herein or other memory elements). In some embodiments, intermediate buffers 116A or 116B may comprise registers, cache memory, and/or other suitable memory elements. The data stored in intermediate buffer 116 may comprise matches (i.e., repeated data sequences that have been encoded in a compressed format) and literal sequences (i.e., uncompressed data sequences that each comprises one or more literal bytes or other grouping of literal data). The matches and literal sequences may be stored in intermediate buffer 116 using any suitable format. In a particular embodiment, a match comprises a length attribute indicating the length of a repeated data sequence and a location attribute indicating a location of an earlier instance of the repeated data sequence. The location attribute may take any suitable form, such as a refer-back distance that indicates how far back (e.g., in bytes or other data unit) the earlier instance of the data sequence appears in the original data set or other suitable form (such as an absolute position within the original data set).

In a particular embodiment, a compression engine 102 stores the data of intermediate buffer 116 in a series of records that each includes an encoding of one literal sequence and one match. Each literal sequence and match of a record have their own length attribute that may be zero or greater (although a literal sequence and a match in the same record will not each have a length of zero). A length of zero for a literal sequence signifies that there is no literal data in the literal sequence. For example, if two matches were found adjacent to each other in the input data set, a literal sequence may be encoded with a length of zero to indicate that there is no uncompressed literal data in between the two matches. Similarly, a length of zero for a match may indicate that no match exists between two literal sequences (e.g., due to hardware limitations or other design constraints, there may be a maximum length for literal sequences and thus a zero length match may be encoded in between two encoded literal sequences that represent one longer literal sequence). Each record includes an indication of the literal sequence length, the literal sequence value (when the length of the literal sequence is greater than zero), the match location (e.g., this may be an offset from the current position in the data set), and the match length. In one embodiment, the match length of a match is the actual length of the match (as opposed to a format such as LZ4 in which the encoded match length is a relative match length that takes into account the minimum match length, thus an encoded match length of zero in LZ4 may indicate a match length of four bytes since four bytes is the minimum match length). In other embodiments, a separate record may comprise an encoding of a literal sequence or an encoding of a match instead of an encoding of both a literal sequence and a match.

Compression control logic 118 may provide operations of compression engine 102 that are not performed by other components of compression engine 102. For example, compression control logic 118 may control the advancement of the short prefixes through the input data set, the copying of data into the history buffer 112, the determination (in conjunction with the compare logic 114) of a best match, the encoding of matches and literal sequences, communication with one or more other compression engines 102 (e.g., to instruct another compression engine that data is ready for compression), or other suitable operations.

Encoding logic 120 of compression engine 102B is operable to access the data compressed by compression engine 102B (which may be stored in intermediate buffer 116B), encode the data in order to further compress the data, and store the encoded data in output buffer 122. Encoding logic 120 may encode the data in any suitable manner. As one example, encoding logic 120 may analyze the data set stored in intermediate buffer 116B to determine which data sequences occur most frequently in the data set and may generate a list of codes, where shorter codes are mapped to the most frequently occurring data sequences, and may then encode the data set using the codes. In one embodiment, encoding logic 120 may employ Huffman encoding to encode the data set. In some embodiments, encoding 120 logic may generate multiple code tables (e.g., one for literal values and one for match locations) and encode separate data types of the data set based on the multiple code tables. The encoded data is placed in output buffer 122, which may include any suitable memory (including the types of memory described herein or other types of memory) for storing a compressed data set. In various embodiments, encoding logic 120 and/or output buffer 122 may be located within compression engine 102B or outside of compression engine 102B.

Although in various embodiments compression engine 102A may be implemented using any suitable logic, in a particular embodiment compression engine 102A is a hardware accelerator that includes specialized hardware (which may or may not be reconfigurable) implementing the logic of compression engine 102A (e.g., hash table control logic 108A, compare logic 114A, and/or compression control logic 118A). As various examples, compression engine 102A may be implemented by a coprocessor, an FPGA, an ASIC, or other suitable logic. In various embodiments, the logic (e.g., compare buffer 106A, hash table control logic 108A, hash table 110A, history buffer 112A, compare logic 114A, intermediate buffer 116A, and/or compression control logic 118A) of compression engine 102A is dedicated to performing compression operations (i.e., the logic is not used for other types of operations as it would be if compression engine 102A were a general purpose processor).

Although in various embodiments compression engine 102B may be implemented using any suitable logic, in a particular embodiment compression engine 102B is a processor (e.g., a CPU) that executes, using one or more processor cores, software instructions to implement the functionality of the logic of compression engine 102B (e.g., hash table control logic 108B, compare logic 114B, compression control logic 118B, and/or encoding logic 120).

In one embodiment where compression engine 102B is a processor, compression engine 102B may receive an instruction to compress a data set and may instruct compression engine 102A to perform a first compression of the data set. In various embodiments, compression engine 102B may communicate the minimum length matches or other parameters associated with the compression to be performed to compression engine 102A and the compression engine 102A is configured accordingly (in other embodiments, compression engine 102A may already be configured appropriately prior to receiving the instruction to compress the data set). Once compression engine 102A has finished compressing all or a portion of the data set, compression engine 102B may retrieve output of compression engine 102A, further compress the data set (or portion thereof) and/or encode the compressed data set (according to various embodiments described herein), and provide the result (e.g., to output buffer 122). In other embodiments, a different processor may receive an instruction to compress a data set and may instruct compression engine 102A in a similar manner as well as instruct compression engine 102B to further compress the output of compression engine 102B.

Figure 2:
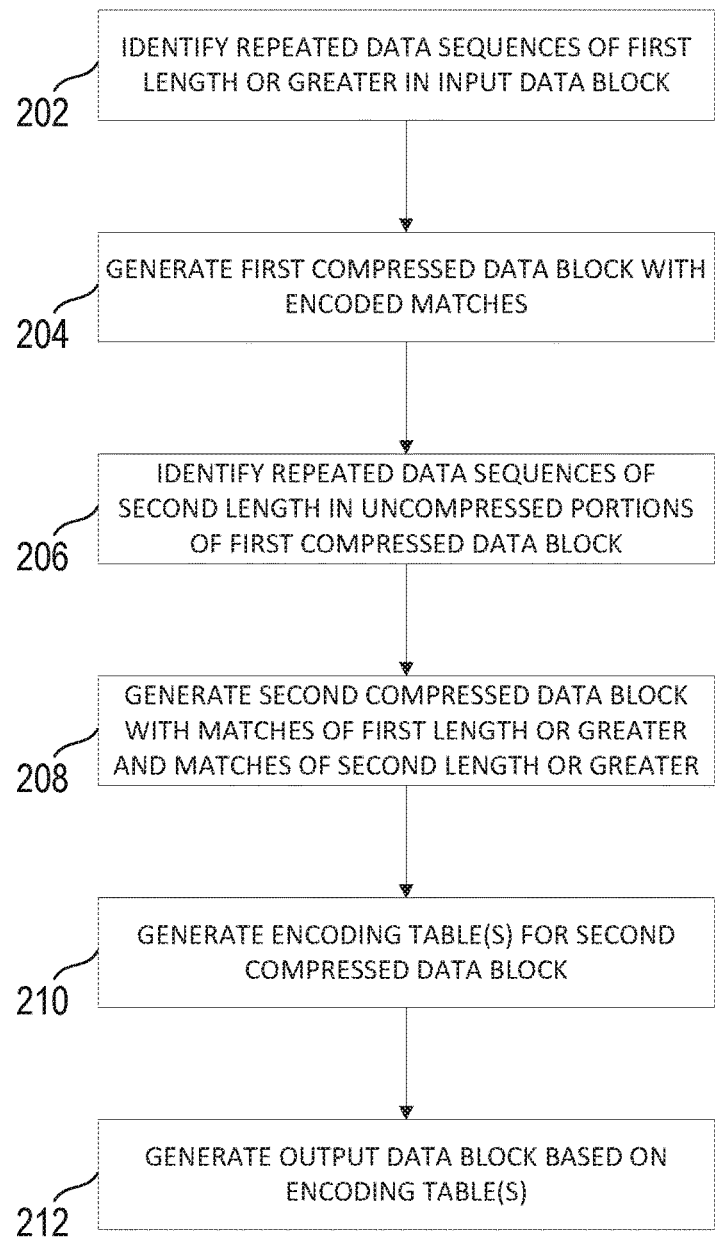
FIG. 2 illustrates a flow for compressing a data set in accordance with certain embodiments.

FIG. 2 illustrates a flow 200 for compressing a data set in accordance with certain embodiments. The operations, along with any other operations described herein relating to compression of a data set, may be performed by any suitable logic, such as compression engines 102 or other suitable logic.

At 202, repeated data sequences of a first length or greater in an input data block are identified. For example, compression engine 102A may iterate through data stored in an input buffer as described above looking for data sequences that match earlier data sequences of the data block (e.g., which may be stored in a history buffer 112A after they have been used as part of a short prefix, e.g., after they pass through the compare buffer 106). At 204, a first compressed data block with encoded matches is generated. For example, compression engine 102A may encode the repeated data sequences it finds as matches comprising a match length and a location (such as a refer-back offset from the current position). The first compressed data block may also comprise various literal sequences for which no matches were found. The first compressed data block may be stored in intermediate buffer 116A.

At 206, repeated data sequences of a second length are identified in uncompressed portions of the first compressed data block. For example, compression engine 102B may iterate through the output of the first compression engine 102A (e.g., the data stored in intermediate buffer 116A) as described above looking for data sequences that match earlier data sequences of the input data block (which may be stored in a history buffer 112B after they have been used as part of a short prefix by compression engine 102B). Specifically, the compression engine 102B looks for repeated data sequences of the second length within the uncompressed portions (i.e., the literal sequences) of the output of compression engine 102A.

At 208, a second compressed data block with matches of the first length or greater and matches of the second length or greater is generated. For example, compression engine 102B may encode the identified repeated data sequences of the second length (or greater) as matches comprising a match length and a position (such as a refer-back offset) and place the encoded matches with the encoded matches from the output of the first compression engine into a buffer (e.g., intermediate buffer 116B). The second compressed data block may also include uncompressed portions (i.e., literal sequences) for which no matches of the second length (or greater) were found.

At 210, one or more encoding tables for the second compressed data block are generated. For example, Huffman encoding tables may be generated for the match locations and the literal values of the second compressed data block. At 212, an output data block is generated based on the one or more encoding tables. In various embodiments, the output data block is generated by the second compression engine 102B, though it may be generated by any suitable logic of a computer system.

The flow described in FIG. 2 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 2 may be repeated, combined, modified or omitted where appropriate. Additionally, operations may be performed in any suitable order without departing from the scope of particular embodiments.

Figure 3:
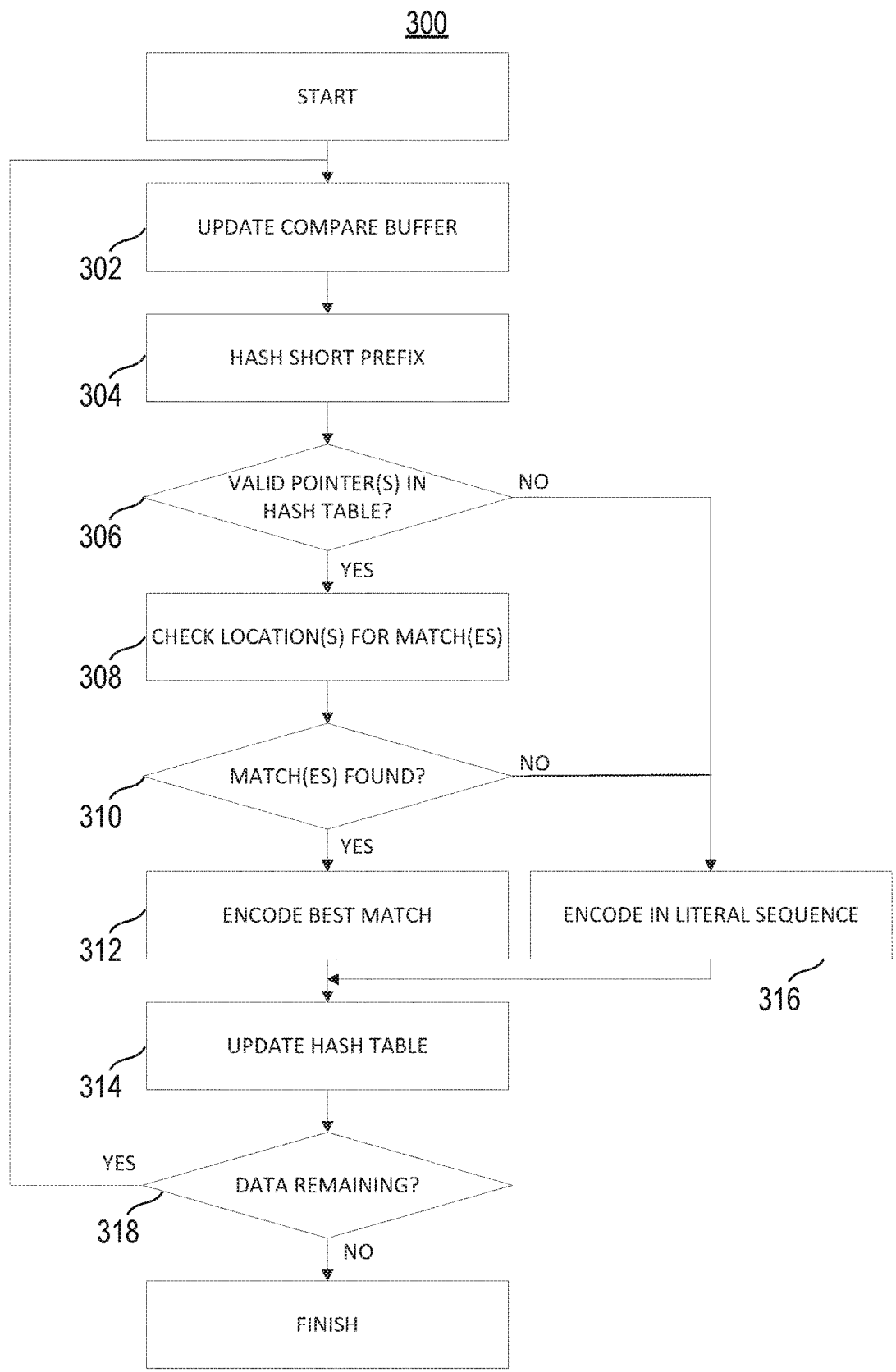
FIG. 3 illustrates a flow for generating a first compressed data set in accordance with certain embodiments.

FIG. 3 illustrates a flow 300 for generating a first compressed data set in accordance with certain embodiments. The operations, along with any other operations described herein relating to compression of a data set, may be performed by any suitable logic, such as compression engine 102A or other suitable logic.

At 302, a compare buffer (e.g., compare buffer 106A) is updated. The first time the compare buffer is updated, an amount of data matching the size of the compare buffer may be copied from an input buffer into the compare buffer. In one embodiment, the size of the short prefix used by the compression engine (and stored in the compare buffer) is four bytes, though any other suitable amount of data may be used. During subsequent updates of the compare buffer, a portion from one end of the compare buffer (e.g., the first byte or other portion of the most recent short prefix) may be dropped from the compare buffer and a portion of the input buffer 104 (e.g., the next byte) may be added to the compare buffer. In various embodiments, the data dropped from the compare buffer may be placed into history buffer 112A. In various embodiments, updating the compare buffer may include copying data from the input buffer to compare buffer 106A. In other embodiments that do not utilize a separate compare buffer, control circuitry may be updated at this point such that updated data from input buffer 104 is provided to logic that operates on the short prefix and subsequent data sequence (e.g., hash table control logic 108A or compare logic 114A).

At 304, the short prefix is hashed to produce a hash value. At 306, it is determined whether one or more valid pointers in the hash table 110A are mapped to the hash value. For example, the hash value may be used as an index into the hash table 110A. If one or more pointers exist at the location identified by the hash value, a determination may be made as to whether any of the pointers are valid at 306. As one example, a pointer may be invalid if it points to data that is no longer in the history buffer (i.e., the data is too far back in the data set). If no valid pointers are found in the hash table, then the flow proceeds to 316. If one or more valid pointers are found at 306, then locations identified by the pointers are accessed at 308 to determine whether data sequences at the locations match at least the short prefix of the compare buffer. In one embodiment, this may comprise comparing the contents of the compare buffer 106 (e.g., the entire compare buffer 106 or a portion thereof) to similarly sized data sequences beginning at the locations identified by the pointers to determine the length of the match (starting with the first byte of the short prefix). In another embodiment, determining whether data sequences at the locations match the data sequence in the window may comprise comparison of the short prefix to the same length of data at the locations identified in the hash table. If a match is found between the short prefix and a data sequence at a location identified by a pointer of the hash table, then data subsequent to the short prefix in the input buffer is compared to data subsequent to the data sequence at the location identified by the pointer of the hash table to determine the length of the match. In various embodiments, comparisons of various lengths of data may be made simultaneously in order to determine what the match length is.

At 310, if no matches are found (e.g., because dissimilar data from a previous portion of the input data set produced the same hash value), the flow moves to 316 where a portion of the data (e.g., the first byte) of the compare buffer (e.g., the portion that will be dropped from the compare buffer and/or placed into the history buffer the next time the compare buffer is updated) is encoded within a literal sequence (or at least set aside for encoding within a literal sequence since the encoding of a literal sequence may utilize the length of the literal sequence which is generally not known until the next match is found).

If one or more matches are found at 310, the best match is encoded at 312. The best match may comprise the longest match found after performing compare operations for data sequences at each valid pointer in the hash table, the longest match found after performing compare operations for a maximum number of data sequences at locations identified by valid pointers of the hash table (e.g., the maximum number may be specified by the particular compression level of the algorithm being performed), a match having a length equal to a specified length (e.g., when the comparison operations stop once a "good enough" match is found), or other suitable match depending on the algorithm used. The match may be encoded in any suitable format. In a particular embodiment, the match is encoded by a length attribute specifying the length of the match and a location attribute (e.g., a refer-back offset) specifying the location of an earlier instance of the matching data sequence.

At 314, the hash table is updated. For example, a pointer to the current location is added to the hash table at the index of the hash value (such that future short prefixes that resolve to hash values matching the hash value may be compared against the current short prefix). In some instances, the pointer may be the first pointer associated with the hash value in the hash table or the pointer may be added to the set of one or more pointers already associated with the hash value (or the pointer may replace the oldest pointer currently associated with the hash value).

At 318, it is determined whether the input buffer 104 includes additional data to be analyzed. If it does not, the flow is finished. If it does, the flow moves back to 302 where the compare buffer is updated. If a match was found in the previous iteration, then compare operations (e.g., 306, 308, and 310) and data encoding operations (e.g., 312 and 316) may be skipped until the compare buffer no longer includes data that was part of the match. However, the hash operations (e.g., 304 and 314) may continue with respect to data that was part of the match so that subsequent data sequences may be compared against the various portions of the match.

The flow described in FIG. 3 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 3 may be repeated, combined, modified or omitted where appropriate. Additionally, operations may be performed in any suitable order without departing from the scope of particular embodiments.

Figure 4:
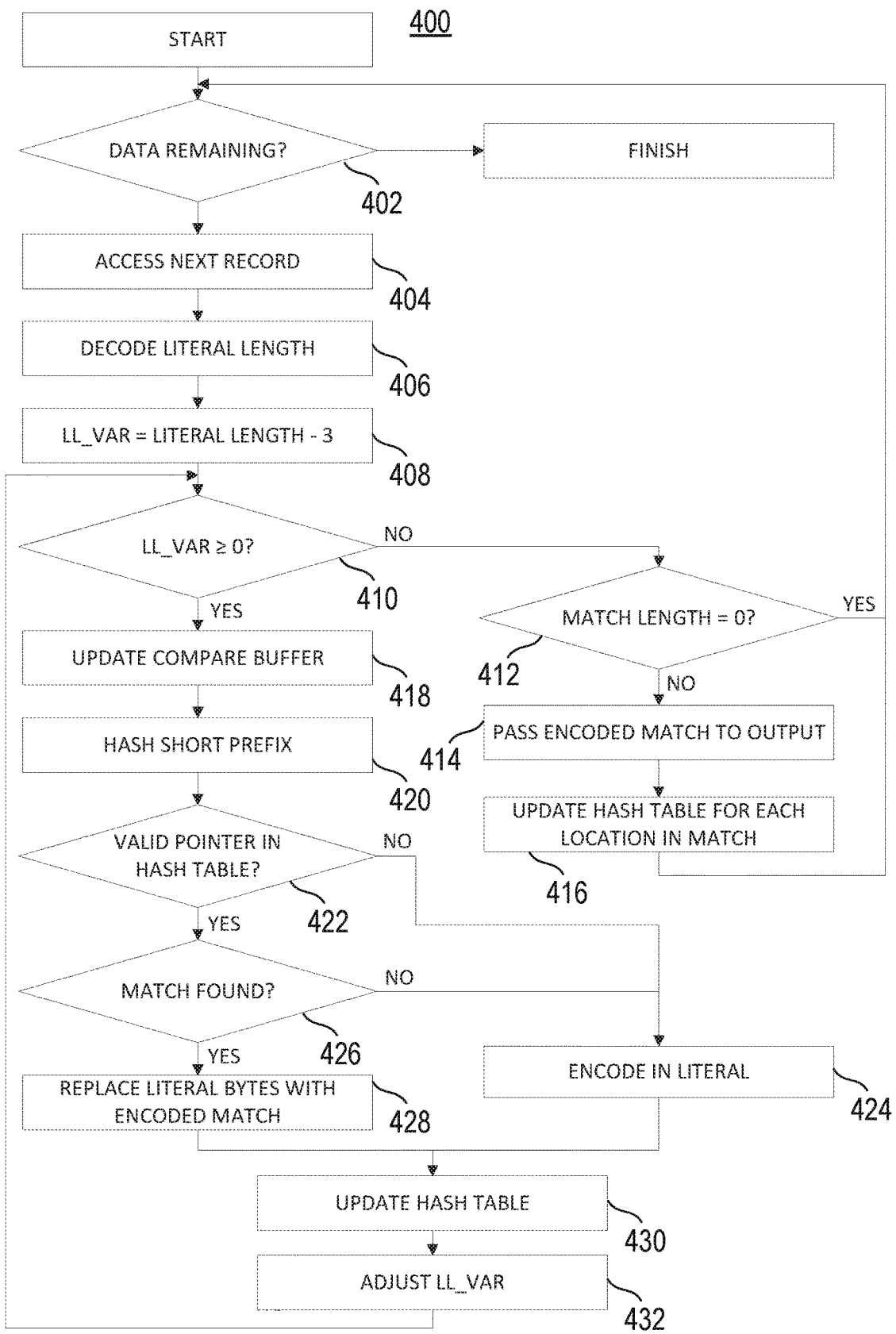
FIG. 4 illustrates a flow for further compressing a first compressed data set to generate a second compressed data set in accordance with certain embodiments.

FIG. 4 illustrates a flow 400 for further compressing a first compressed data set to generate a second compressed data set in accordance with certain embodiments. The operations, along with any other operations described herein relating to compression of a data set, may be performed by any suitable logic, such as compression engine 102B or other suitable logic. Various flow operations are described with respect to FIG. 4 under the assumption that the first compressed data set comprises a plurality of records that each includes an encoding of a literal sequence and a match. However, the present disclosure contemplates any suitable format for storing the literal sequences and matches within the first compressed data set and for processing them when generating the second compressed data set. Various operations of flow 400 may be similar to operations of flow 300 and may be performed in similar manners, adapted of course to the parameters of the compression engine 102B (even if the various characteristics of the operations are not explicitly described below).

At 402, it is determined whether data from the first compressed data set remains to be processed. If further data is to be processed, a next record of the first compressed data set is accessed at 404. At 406, the length of the literal sequence of the record is decoded. As just one example, a header of the record that specifies the length of the literal sequence may be accessed and the length decoded from the header. At 408 a literal length variable (LL_VAR) is set based on the decoded literal sequence length and the minimum match length to be found by the second compression engine (102B). In this example, the minimum match length is assumed to be three bytes. Accordingly, at 410, LL_VAR is set to the decoded literal sequence length minus three.

At 410, it is determined whether LL_VAR is greater than or equal to zero. In this example, if the decoded length of the literal sequence was one or two (and thus the initial LL_VAR value would be less than zero), various operations of the flow may be skipped since the compression engine 102B does not compress literal sequences that are shorter than the minimum length. When LL_VAR is less than zero, the flow moves to 412 where a match length identified in the record is decoded. If the match length is zero (signifying no actual encoded match), the flow returns to the beginning at 402. If the match length is not zero, then the match in the record (which was already encoded by the other compression engine 102A) is passed to the output at 414. Alternatively, if the format of the output of the second compression engine 102B differs from the format of the output of the first compression engine 102A, the encoded match may be modified to comply with the format of the output of the second compression engine 102B at 414. At 416, the hash table 110B of the second compression engine 102B is updated for each location in the match. That is, the data represented by the match is iterated through and for each short prefix (having the minimum length used by compression engine 102B), a hash is performed and a corresponding pointer to the location of the data sequence is associated with the hash value and added to the hash table. In various embodiments, this may involve decoding the match to reproduce the original data. In other embodiments, the original data set may be accessible by the compression engine 102B such that the match does not need to be decoded in order to hash each short prefix in the match (in such embodiments, the corresponding location in the original data set may be tracked throughout the flow 400). After the hash table is updated, the flow returns to 402. Note that a portion of data represented by the match could also be used when a hash is performed to update the hash table (e.g., when the short prefix is longer than the remaining amount of data in a literal sequence, the short prefix may be filled out with data from the next match).

At 410, if LL_VAR is greater than or equal to zero, then the literal sequence is searched for matches having at least the minimum length. At 418, the data of a compare buffer (e.g., compare buffer 106B) is updated. This operation may be similar to operation 302, but in this case the data for the compare buffer 106B is obtained from a literal sequence in a record of the first compressed data set stored, e.g., in intermediate buffer 116A (or from a corresponding location in the input buffer 104 or other buffer that stores the input data set). In various embodiments, the short prefix (that may be stored in the compare buffer 106B) used by compression engine 102B has a smaller size than the short prefix used by compression engine 102A. At 420, the short prefix is hashed to obtain a hash value. The hash value is looked up in a hash table and a determination is made as to whether the hash value is associated with a valid pointer at 422. If it is not, a portion of the data (e.g., the first byte) of the compare buffer (e.g., the portion that will be dropped from the compare buffer and/or placed into the history buffer the next time the compare buffer is updated) is encoded within a literal sequence (or at least set aside for encoding within a literal sequence since the encoding of a literal sequence may utilize the length of the literal sequence which is generally not known until the next match is found) at 426.

If a valid pointer is found at 422, then a comparison between the short prefix (and subsequent data from the literal sequence) and the data sequence at the location identified by the pointer is made at 426. If no match is found, the flow moves to 424. If a match is found, the literal bytes of the data sequence (starting with the short prefix) that are found to be matching are replaced with an encoded match (which may be of the minimum length or a greater length) at 428. The match may be represented in a similar manner as the matches of the first compressed data set (i.e., the match has a length attribute and a position attribute). In a particular embodiment, only a single location identified by a pointer is accessed for the comparison (in order to save time). However, in other embodiments, multiple locations identified by multiple pointers associated with the hash value could be accessed for comparison against the short prefix (and subsequent data of the literal sequence).

At 430, the hash table 110B is updated with an association between the hash value and a pointer to the current location. At 432, LL_VAR is updated. If no match was found at 426, LL_VAR may be decremented by one and the compare buffer (and short prefix stored therein) will advance by one byte (or other data amount) within the literal sequence that is being checked for matches. It should be noted that if a match was found at 426, operations 422, 424, 426, and 428 may be skipped so as to advance the compare buffer past the match before additional comparison and encoding operations are performed on the literal sequence. In such a case, operation 430 may still be performed to updated the hash table for each position within the match to allow subsequent data to be compared against each of the short prefixes that begins with data from the match.

The flow described in FIG. 4 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 4 may be repeated, combined, modified or omitted where appropriate. Additionally, operations may be performed in any suitable order without departing from the scope of particular embodiments.

FIG. 5 illustrates a first example compressed data set 508 in accordance with certain embodiments. The first example hash table 506 and first compressed data set 508 represent a hash table and data set that may be generated by, e.g., a first compression engine 102A that is configured to encode a minimum match length of four bytes and to store the encoded data in records 510. An example input data set 502 is shown, with each character of the data set representing a distinct byte. The hash table 506 (or other hash table used by either compression engine) may include a plurality of pointers that are each associated with a hash value. A hash value may be associated with one or more of the pointers. The association may be made in any suitable manner. In one example, the hash value is an index that identifies a location within a data structure storing the pointers, such that when the data structure is access at the index, the associated pointer(s) may be accessed. In another embodiment, the hash value could be stored in the data structure along with the associated pointers or associated with the pointers in any other suitable manner.

Short prefix table 504 depicts the values of the short prefixes at various points during the compression. The first short prefix includes the first four bytes (ABCD) from the input data set. This value is hashed to produce a hash value (ABCD$_H$). At this point, the hash value is not associated with any pointers, thus no comparison is made and the first byte of the short prefix (A) is designated for encoding within a literal sequence in record 510A. The hash value is associated with a pointer (0) to the current location in the hash table 506. The short prefix is updated to the next position and now comprises BCDE. In various embodiments, the data (A) dropped from the short prefix may be added to a history buffer at a location corresponding to the location (0) that was just added to the hash table. A hash function is performed on BCDE and because there are no matches, B is encoded as a literal (within a literal sequence) and BCDE$_H$ is associated with the current position (1) in the hash table.

The iterations may continue in this manner until the short prefix again includes the value ABCD. At this point, a hash value (ABCD$_H$) is calculated and the hash table is accessed based on the hash value. The hash table does include a pointer (0) associated with the hash value, therefore data at the location identified by the pointer is compared against data that begins with the data in the current position (9) and a match is found. In fact, the match length is longer than the minimum match length since the data sequence ABCDE which begins at the current position (9) is a repeat of the data sequence ABCDE which begins at the location of the pointer (0). At this stage, the first record 510A may be created. The record includes a literal sequence with a length of nine and a value of ABCDEABCF. The record also includes a match with a length of five and a distance of nine which represents the location of the beginning of the repeated data sequence (in alternative embodiments the location may be represented in any other suitable manner) with respect to the current position. Hashing operations are continued on the short prefix data as the data advances, but no comparisons are made or literal encoding performed on the data that is already encoded in the most recent match. Accordingly, a new pointer is associated with BCDE$_H$, and hash values CDEK$_H$, DEKA$_H$, and EKAB$_H$ are associated with their respective pointers in the hash table. Once the data already encoded in the match has been flushed from the short prefix, the comparison operations and literal encoding operations may resume. For example, when the short prefix includes KABC, the hash table is accessed to determine whether a valid pointer associated with KABC$_H$ exists (it does not and thus KABC$_H$ is associated with a pointer to the current position in the hash table). Accordingly, the value K from the short prefix is designated for encoding in a literal sequence. The short prefix is updated to ABCD. ABCD is hashed and the data sequences at locations indicated by the pointers associated with hash value ABCD$_H$ are compared with the current short prefix (ABCD) and subsequent data (GHI) to determine whether a match exists (and if multiple matches exist to determine the best match). In this case, two matches of equal length (4 bytes) are found starting at location 9 and location 0. In a particular embodiment, when matches of equal length are found, the closest match may be used for the encoding, though other embodiments may use any suitable match for encoding. Accordingly, record 510B includes a literal sequence having a length of one and a value of K and a match having a length of four and a distance of six. Hashes continue on BCDG, CDGH, DGHI and because the end of the data set is reached, record 510C is created with a literal sequence having a length of three and a value of GHI and a match having a length of zero. In various embodiments, the compressed data set 508 is then provided to a second compression engine 102B. The further compression of the compressed data set 508 is explained in connection with FIG. 6.

FIG. 6 illustrates a second example compressed data set 608 in accordance with certain embodiments. The second example hash table 606 and second compressed data set 608 represent a hash table and data set that may be generated by, e.g., a second compression engine 102B that is configured to encode a minimum match length of three bytes and to store the encoded data in records 610.

Short prefix table 604 depicts the values of the short prefix at various points during the further compression of the first compressed data set. During this second pass, the second compression engine 102B looks for data sequences in the literal sequences of the first compressed data set that match previous data sequences in the data set. The bolded values in the second compressed data set 608 represent a new match and two new literal sequences generated by the second compression engine (while the other matches and literal sequences are the same as corresponding matches and literal sequences of the first compressed data set).

First, the values of the literal sequences of record 510A are passed through the short prefix and matches are sought. In a similar manner to the example of FIG. 5, the hash table 606 is accessed and updated as the values of the literal sequence are iterated through. When the short prefix includes the second instance of ABC, the pointer associated with the hash value ABC$_H$ in the hash table 606 is accessed and the data sequence at that location is compared against the data sequence at the current location (beginning with the short prefix) to determine whether a match exists and if a positive match is found, how long the match is (in various embodiments, the comparison may be bounded by the end of the current literal sequence since subsequent data may already be encoded in a match found by the first compression engine). In this case, the match is of length three. Accordingly, the portion of the literal sequence for which no matches were found (in this case ABCDE) is encoded as a literal sequence having length five in a record 610A along with a match having a length of three and a distance of five (which refers back to the previous instance of ABC). After this match, F is the only value remaining in the literal sequence, so it is encoded as a literal sequence of length one in record 610B along with the match previously found by the first compression engine (corresponding to the repeated instance of ABCDE) which may be passed through to the output. Despite no comparison or encoding operations being performed on the values represented by this match, the values may still pass through the short prefix so that they can be hashed and the hash table 606 can be updated accordingly.

In the hash table 606, the values lined through represent pointers that were once valid and then overwritten (since in this embodiment, compression engine 102B may only compare the data starting with the short prefix for a match against the data starting at a single location indicated by a pointer in the hash table). Accordingly, when the second instance of ABC is found, the pointer associated with $ABC_H$ is overwritten to the value of five, when the third instance of ABC is found, the pointer is overwritten to nine, and when the fourth instance is found, the pointer is overwritten to a value of fifteen.

Since the length of the literal sequence in the next record 610C is less than the minimum match length (three bytes), the literal sequence and the accompanying match are passed straight through to the output (but the data slides through the short prefix so that the hash table can be updated) and thus are shown in bold. When the last record is processed, the value GHI is placed in the short prefix and hashed, but since no matches are found, GHI is encoded as a literal sequence and a match length of zero is added to record 610D, thus completing the generation of the second compressed data set 608. In various embodiments, the second compressed data set may be compressed further (e.g., by Huffman or other encoding) before being output (e.g., in an output buffer 122).

Figure 7:
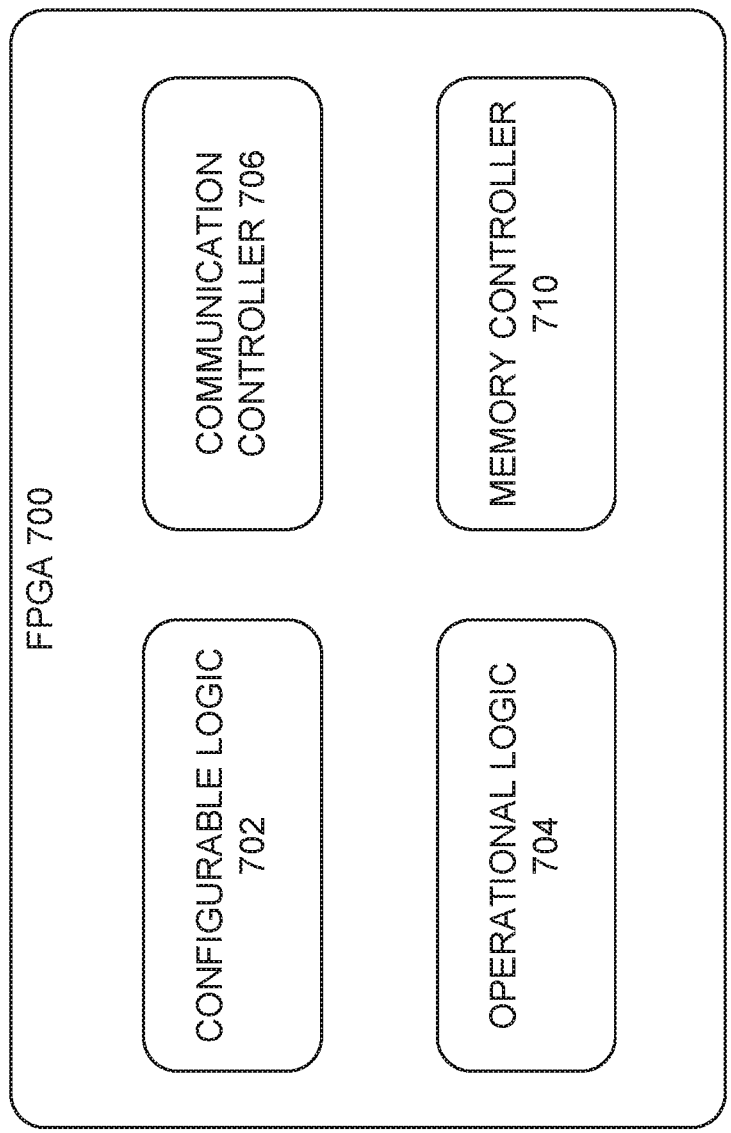
FIG. 7 illustrates an example block diagram of a field programmable gate array (FGPA) in accordance with certain embodiments.

FIG. 7 illustrates an example block diagram of a field programmable gate array (FGPA) 700 in accordance with certain embodiments. In a particular embodiment, a compression engine 102 may be implemented by an FPGA 700. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 700 includes configurable logic 702, operational logic 704, communication controller 706, and memory controller 710. Configurable logic 702 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a compression engine 102. Some FPGAs 700 may be limited to executing a single kernel at a time while other FPGAs may be capable of executing multiple kernels simultaneously. The configurable logic 702 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 704 may access a data structure defining a kernel and configure the configurable logic 702 based on the data structure and perform other operations of the FPGA. In some embodiments, operational logic 704 may write control bits to memory (e.g., nonvolatile flash memory or SRAM based memory) of the FPGA 700 based on the data structure, wherein the control bits operate to configure the logic (e.g., by activating or deactivating particular interconnects between portions of the configurable logic). The operational logic 704 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 706 may enable FPGA 700 to communicate with other components (e.g., another compression engine 102) of a computer system (e.g., to receive commands to compress data sets). Memory controller 710 may enable the FPGA to read data (e.g., operands or results) from or write data to memory of the computer system 100. In various embodiments, memory controller 710 may comprise a direct memory access (DMA) controller.

In various embodiments, a compression engine 102 may be implemented by one or more processor cores of a processor. Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 8A is a block diagram illustrating both an exemplary in-order pipeline and an exemplary register renaming, out-of-order issue/execution pipeline according to embodiments of the disclosure. FIG. 8B is a block diagram illustrating both an exemplary embodiment of an in-order architecture core and an exemplary register renaming, out-of-order issue/execution architecture core to be included in a processor according to embodiments of the disclosure. The solid lined boxes in FIGS. 8A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end unit 830 coupled to an execution engine unit 850, and both are coupled to a memory unit 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, coprocessor core, general purpose computing graphics processing unit (GPGPU) core, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (or decoder) may decode instructions, and generate as an output one or more micro-operations, micro-code entry points, microinstructions, other instructions, or other control signals, which are decoded from, or which otherwise reflect, or are derived from, the original instructions. The decode unit 840 may be implemented using various different mechanisms. Examples of suitable mechanisms include, but are not limited to, look-up tables, hardware implementations, programmable logic arrays (PLAs), microcode read only memories (ROMs), etc. In one embodiment, the core 890 includes a microcode ROM or other medium that stores microcode for certain macroinstructions (e.g., in decode unit 840 or otherwise within the front end unit 830). The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 858 comprises a vector registers unit, a write mask registers unit, and a scalar registers unit. These register units may provide architectural vector registers, vector mask registers, and general purpose registers. The physical register file(s) unit(s) 858 is overlapped by the retirement unit 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary embodiment, the memory access units 864 may include a load unit, a store address unit, and a store data unit, each of which is coupled to the data TLB unit 872 in the memory unit 870. The instruction cache unit 834 is further coupled to a level 2 (L2) cache unit 876 in the memory unit 870. The L2 cache unit 876 is coupled to one or more other levels of cache and eventually to a main memory.

By way of example, the exemplary register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 890 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIGS. 9A-B illustrate a block diagram of a more specific exemplary in-order core architecture, which core would be one of several logic blocks (potentially including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 9A is a block diagram of a single processor core, along with its connection to the on-die interconnect network 902 and with its local subset of the Level 2 (L2) cache 904, according to various embodiments. In one embodiment, an instruction decoder 900 supports the x86 instruction set with a packed data instruction set extension. An L1 cache 906 allows low-latency accesses to cache memory into the scalar and vector units. While in one embodiment (to simplify the design), a scalar unit 908 and a vector unit 910 use separate register sets (respectively, scalar registers 912 and vector registers 914) and data transferred between them is written to memory and then read back in from a level 1 (L1) cache 906, alternative embodiments may use a different approach (e.g., use a single register set or include a communication path that allow data to be transferred between the two register files without being written and read back).

The local subset of the L2 cache 904 is part of a global L2 cache that is divided into separate local subsets (in some embodiments one per processor core). Each processor core has a direct access path to its own local subset of the L2 cache 904. Data read by a processor core is stored in its L2 cache subset 904 and can be accessed quickly, in parallel with other processor cores accessing their own local L2 cache subsets. Data written by a processor core is stored in its own L2 cache subset 904 and is flushed from other subsets, if necessary. The ring network ensures coherency for shared data. The ring network is bi-directional to allow agents such as processor cores, L2 caches and other logic blocks to communicate with each other within the chip. In a particular embodiment, each ring data-path is 1012-bits wide per direction.

FIG. 9B is an expanded view of part of the processor core in FIG. 9A according to embodiments. FIG. 9B includes an L1 data cache 906A (part of the L1 cache 906), as well as more detail regarding the vector unit 910 and the vector registers 914. Specifically, the vector unit 910 is a 16-wide vector processing unit (VPU) (see the 16-wide ALU 928), which executes one or more of integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating resulting vector writes.

Figure 10:
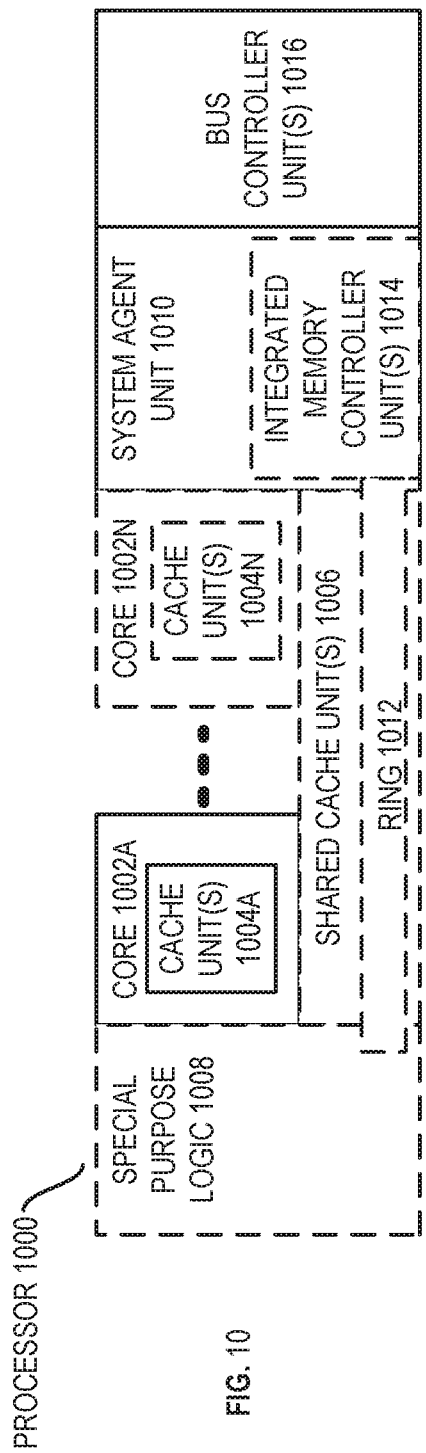
FIG. 10 is a block diagram of a processor that may have more than one core, may have an integrated memory controller, and may have integrated graphics in accordance with certain embodiments.

FIG. 10 is a block diagram of a processor 1000 that may have more than one core, may have an integrated memory controller, and may have integrated graphics according to various embodiments. The solid lined boxes in FIG. 10 illustrate a processor 1000 with a single core 1002A, a system agent 1010, and a set of one or more bus controller units 1016; while the optional addition of the dashed lined boxes illustrates an alternative processor 1000 with multiple cores 1002A-N, a set of one or more integrated memory controller unit(s) 1014 in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, or a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (e.g., including 30 or more cores), embedded processor, or other fixed or configurable logic that performs logical operations. The processor may be implemented on one or more chips. The processor 1000 may be a part of and/or may be implemented on one or more substrates using any of a number of process technologies, such as, for example, BiCMOS, CMOS, or NMOS.

In various embodiments, a processor may include any number of processing elements that may be symmetric or asymmetric. In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring based interconnect unit 1012 interconnects the special purpose logic (e.g., integrated graphics logic) 1008, the set of shared cache units 1006, and the system agent unit 1010/ integrated memory controller unit(s) 1014, alternative embodiments may use any number of well-known techniques for interconnecting such units. In one embodiment, coherency is maintained between one or more cache units 1006 and cores 1002A-N.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the special purpose logic 1008. The display unit is for driving one or more externally connected displays.

The cores 1002A-N may be homogenous or heterogeneous in terms of architecture instruction set; that is, two or more of the cores 1002A-N may be capable of executing the same instruction set, while others may be capable of executing only a subset of that instruction set or a different instruction set.

FIGS. 11-14 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable for performing the methods described in this disclosure. In general, a huge variety of systems or electronic devices capable of incorporating a processor and/or other execution logic as disclosed herein are generally suitable.

Figure 11:
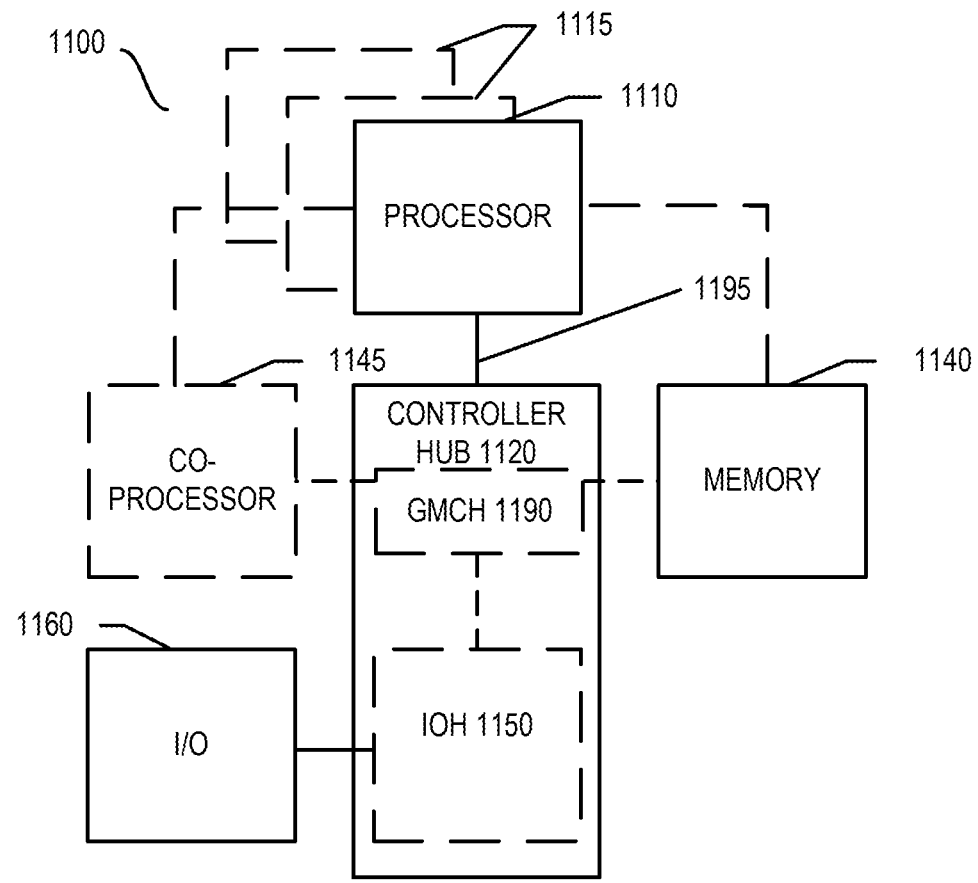
FIGS. 11-14 are block diagrams of exemplary computer architectures in accordance with certain embodiments.

FIG. 11 depicts a block diagram of a system 1100 in accordance with one embodiment of the present disclosure. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips or the same chip); the GMCH 1190 includes memory and graphics controllers coupled to memory 1140 and a coprocessor 1145; the IOH 1150 couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 is a single chip comprising the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), other suitable memory, or any combination thereof. The memory 1140 may store any suitable data, such as data used by processors 1110, 1115 to provide the functionality of computer system 1100. For example, data associated with programs that are executed or files accessed by processors 1110, 1115 may be stored in memory 1140. In various embodiments, memory 1140 may store data and/or sequences of instructions that are used or executed by processors 1110, 1115.

In at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In one embodiment, the coprocessor 1145 is a special-purpose processor, such as, for example, a high-throughput MIC processor, a network or communication processor, compression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
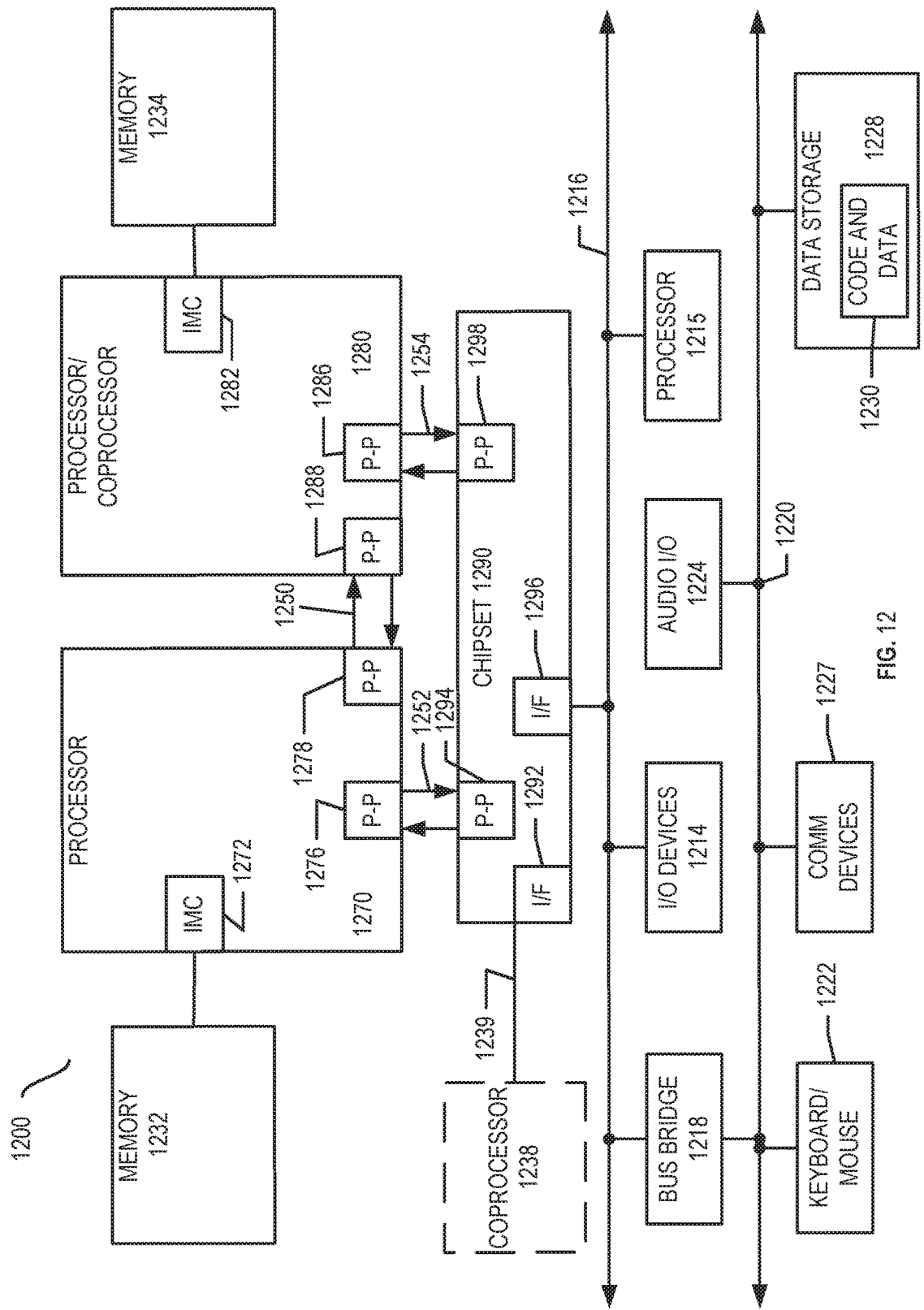

FIG. 12 depicts a block diagram of a first more specific exemplary system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment of the disclosure, processors 1270 and 1280 are respectively processors 1110 and 1115, while coprocessor 1238 is coprocessor 1145. In another embodiment, processors 1270 and 1280 are respectively processor 1110 and coprocessor 1145.

Processors 1270 and 1280 are shown including integrated memory controller (IMC) units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In one embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via a P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPU's, accelerators (such as, e.g., graphics accelerators or digital signal processing (DSP) units), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in one embodiment. Further, an audio I/O 1224 may be coupled to the second bus 1220. Note that other architectures are contemplated by this disclosure. For example, instead of the point-to-point architecture of FIG. 12, a system may implement a multi-drop bus or other such architecture.

Figure 13:
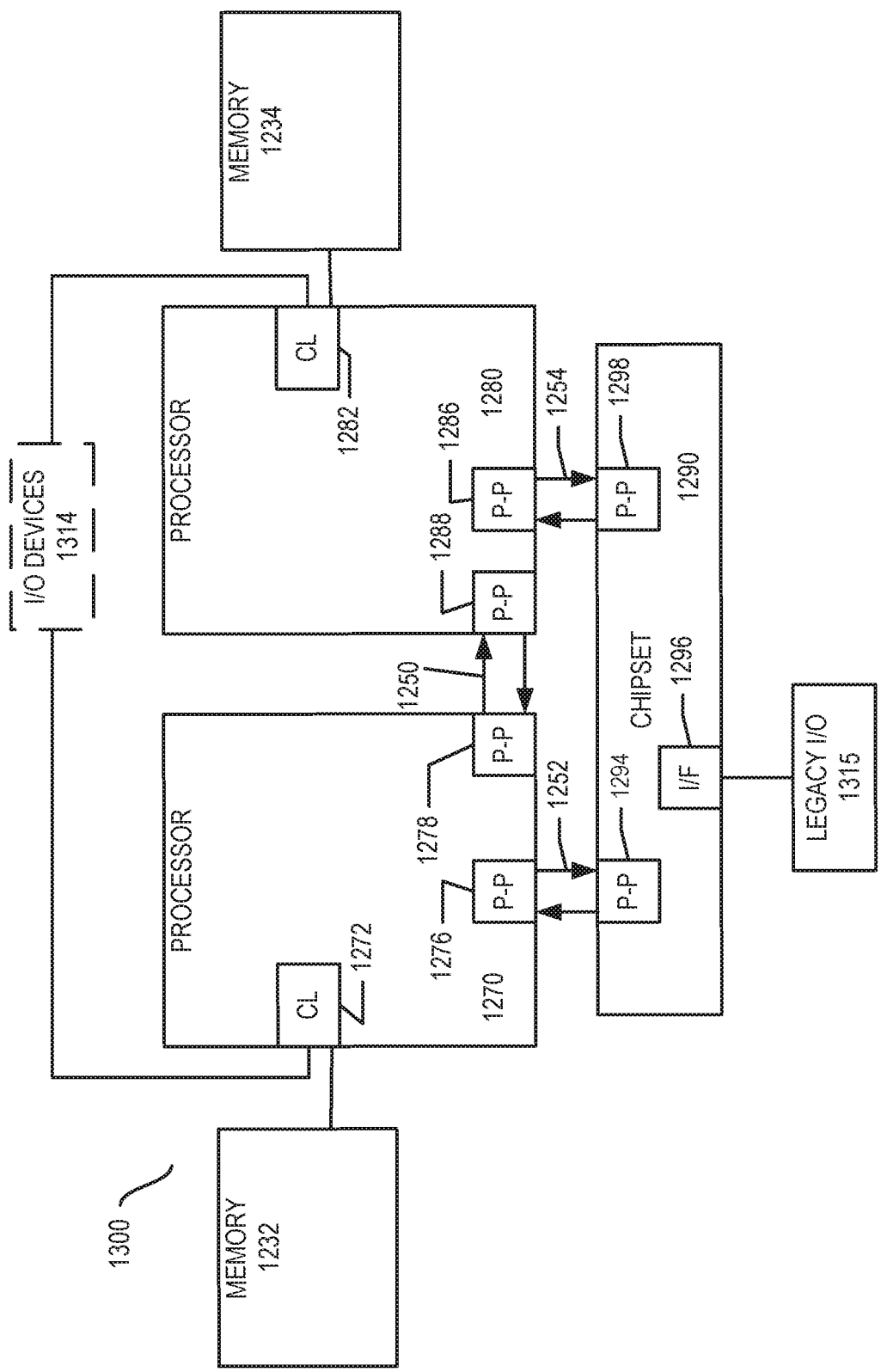

FIG. 13 depicts a block diagram of a second more specific exemplary system 1300 in accordance with an embodiment of the present disclosure. Similar elements in FIGS. 12 and 13 bear similar reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller units and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
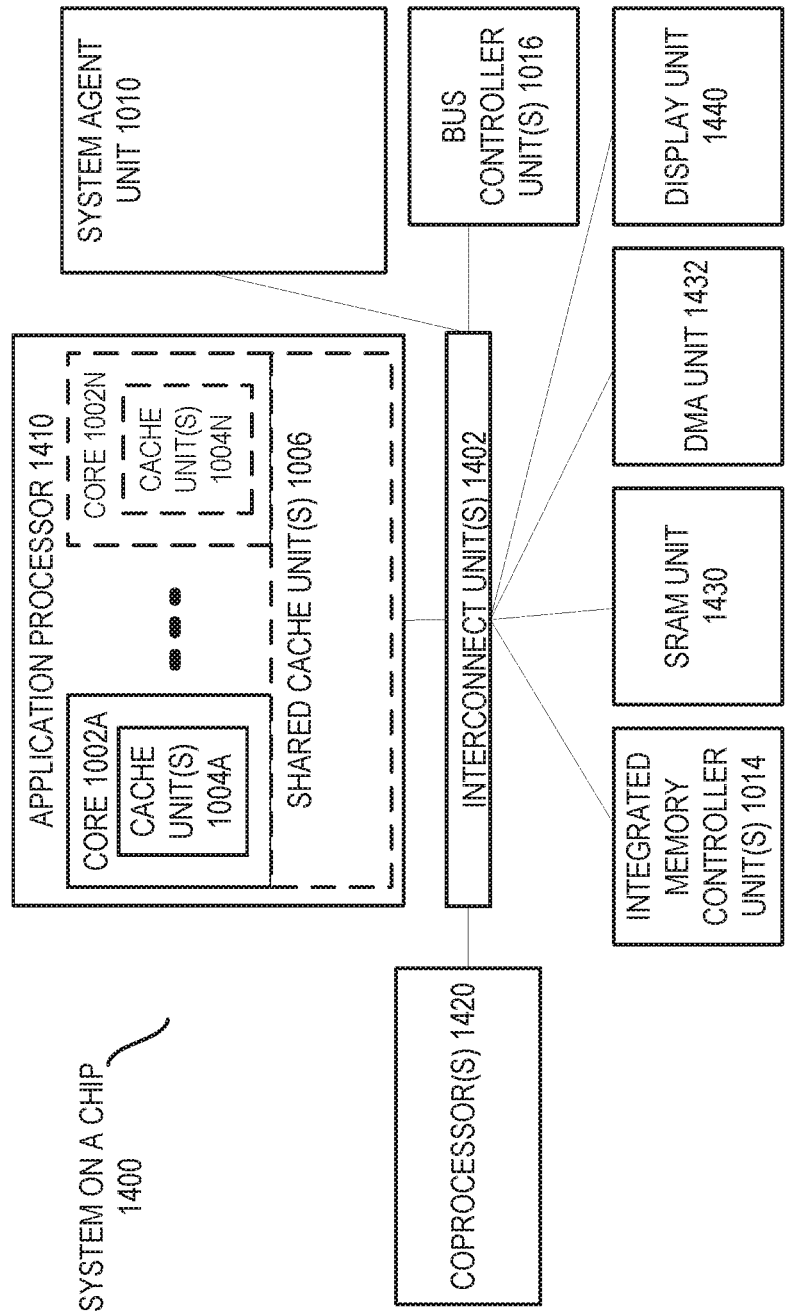

FIG. 14 depicts a block diagram of a SoC 1400 in accordance with an embodiment of the present disclosure. Similar elements in FIG. 10 bear similar reference numerals. Also, dashed lined boxes are optional features on more advanced SoCs. In FIG. 14, an interconnect unit(s) 1402 is coupled to: an application processor 1410 which includes a set of one or more cores 202A-N and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the functionality of the various components such as compression engines 102; FPGA 700; core 890; processor 1000; systems 1100, 1200, and 1300; and SoC 1400 (or any of the components of any of these), or other component described herein. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

A memory element may include non-volatile memory and/or volatile memory. Non-volatile memory is a storage medium that does not require power to maintain the state of data stored by the medium. Nonlimiting examples of non-volatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM).

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprises a first compression engine to receive a first compressed data block from a second compression engine that is to generate the first compressed data block by compressing a first plurality of repeated instances of data that each have a length greater than or equal to a first length; and compress a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated; and a memory buffer to store the compressed first and second plurality of repeated instances of data.

In an embodiment, the first compressed data block comprises a plurality of records, a record comprising a compressed repeated instance of data and an uncompressed portion of data of an input data set. In an embodiment, the first compression engine is further to identify a repeated instance of data by performing a hash function on a short prefix of data of the first compressed data block to generate a hash value, the short prefix of data having a size equal to the second length; identifying a location associated with the hash value; and determining that the short prefix of data matches data at the location associated with the hash value. In an embodiment, the first compression engine is further to determine a data sequence corresponding to a compressed repeated instance of data of the first compressed data block; apply a hash function to a short prefix of the data sequence to generate a hash value; and store a pointer associated with a location of the data sequence in a memory element to be used to access the data sequence for comparison against a short prefix of data of an uncompressed portion of the first compressed data block. In an embodiment, the data sequence is determined by decoding the compressed repeated instance of data. In an embodiment, the data sequence is obtained from an input data set without decoding the compressed repeated instance of data by accessing the input data set at a location corresponding to the location of the compressed repeated instance of data. In an embodiment, the first length is one byte greater than the second length. In an embodiment, the first length is four bytes and the second length is three bytes. In an embodiment, the first compression engine is a processor comprising at least one processor core. In an embodiment, the second compression engine is a hardware accelerator. In an embodiment, a first hash table generated by the first compression engine is to include a maximum of a single location associated with each hash value of the first hash table; and a second hash table generated by the second compression engine is to include a plurality of locations associated with each of at least some of the hash values of the second hash table. In an embodiment, the first compression engine is further to instruct the second compression to generate the first compressed data block. In an embodiment, the apparatus further comprises the second compression engine. In an embodiment, the apparatus further comprises a battery communicatively coupled to the first compression engine, a display communicatively coupled to the first compression engine, or a network interface communicatively coupled to the first compression engine.

In at least one embodiment, a method comprises receiving, by a first compression engine, a first compressed data block from a second compression engine that is to generate the first compressed data block by compressing a first plurality of repeated instances of data that each have a length greater than or equal to a first length; and compressing, by the first compression engine, a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated.

In an embodiment, the first compressed data block comprises a plurality of records, a record comprising a compressed repeated instance of data and an uncompressed portion of data of an input data set. In an embodiment, the method further comprises identifying a repeated instance of data by performing a hash function on a short prefix of data of the first compressed data block to generate a hash value, the short prefix of data having a size equal to the second length; identifying a location associated with the hash value; and determining that the short prefix of data matches data at the location associated with the hash value. In an embodiment, the method further comprises determining a data sequence corresponding to a compressed repeated instance of data of the first compressed data block; applying a hash function to a short prefix of the data sequence to generate a hash value; and storing a pointer associated with a location of the data sequence in a hash table to be used to access the data sequence for comparison against a short prefix of data of an uncompressed portion of the first compressed data block. In an embodiment, the data sequence is determined by decoding the compressed repeated instance of data. In an embodiment, the data sequence is obtained from an input data set without decoding the compressed repeated instance of data by accessing the input data set at a location corresponding to the location of the compressed repeated instance of data. In an embodiment, the first length is one byte greater than the second length. In an embodiment, the first length is four bytes and the second length is three bytes. In an embodiment, a first hash table generated by the first compression engine is to include a maximum of a single location associated with each hash value of the first hash table; and a second hash table generated by the second compression engine is to include a plurality of locations associated with each of at least some of the hash values of the second hash table. In an embodiment, the method further comprises instructing, by the first compression engine, the second compression to generate the first compressed data block. In an embodiment, a system comprises means to perform any of the methods. In an embodiment, the means comprise machine-readable code that when executed, cause a machine to perform one or more steps of the method of any of the methods.

In at least one embodiment, a system comprises a first compression engine to generate a first compressed data block by compressing a first plurality of repeated instances of data that each have a length greater than or equal to a first length; and a second compression engine to compress a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated.

In an embodiment, the first compression engine is a hardware accelerator and the second compression engine is a processor comprising at least one processor core. In an embodiment, the system further comprises a battery communicatively coupled to the second compression engine, a display communicatively coupled to the second compression engine, or a network interface communicatively coupled to the second compression engine.

In at least one embodiment, a system comprises means for receiving a first compressed data block from a compression engine that is to generate the first compressed data block by compressing a first plurality of repeated instances of data that each have a length greater than or equal to a first length; and means for compressing a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated.

In an embodiment, the system further comprises means for identifying a repeated instance of data by performing a hash function on a short prefix of data of the first compressed data block to generate a hash value, the short prefix of data having a size equal to the second length; identifying a location associated with the hash value; and determining that the short prefix of data matches data at the location associated with the hash value. In an embodiment, the system further comprises means for determining a data sequence corresponding to a compressed repeated instance of data of the first compressed data block; means for applying a hash function to a short prefix of the data sequence to generate a hash value; and means for storing a pointer associated with a location of the data sequence in a hash table to be used to access the data sequence for comparison against a short prefix of data of an uncompressed portion of the first compressed data block. In an embodiment, the first length is one byte greater than the second length. In an embodiment, the first length is four bytes and the second length is three bytes.

In at least one embodiment, at least one non-transitory machine accessible storage medium has instructions stored thereon, the instructions when executed on a machine, to cause the machine to receive, by a first compression engine, a first compressed data block from a second compression engine that is to generate the first compressed data block by compressing a first plurality of repeated instances of data that each have a length greater than or equal to a first length; and compress, by the first compression engine, a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated. In an embodiment, the first compression engine is a processor comprising at least one processor core and the second compression engine is a hardware accelerator. In an embodiment, the instructions when executed are further to cause the machine to identify a repeated instance of data by performing a hash function on a short prefix of data of the first compressed data block to generate a hash value, the short prefix of data having a size equal to the second length; identifying a location associated with the hash value; and determining that the short prefix of data matches data at the location associated with the hash value. In an embodiment, the first length is one byte greater than the second length.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
  a first compression engine to:
    receive a first compressed data block from a second compression engine that is to generate the first compressed data block by compressing a first plurality of repeated instances of data that each have a length greater than or equal to a first length; and
    compress a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated; and
  a memory buffer to store the compressed first and second plurality of repeated instances of data.

2. The apparatus of claim 1, wherein the first compressed data block comprises a plurality of records, a record comprising a compressed repeated instance of data and an uncompressed portion of data of an input data set.

3. The apparatus of claim 1, the first compression engine further to identify a repeated instance of data by:
  performing a hash function on a short prefix of data of the first compressed data block to generate a hash value, the short prefix of data having a size equal to the second length;
  identifying a location associated with the hash value; and
  determining that the short prefix of data matches data at the location associated with the hash value.

4. The apparatus of claim 1, wherein the first compression engine is further to:
  determine a data sequence corresponding to a compressed repeated instance of data of the first compressed data block;
  apply a hash function to a short prefix of the data sequence to generate a hash value; and
  store a pointer associated with a location of the data sequence in a memory element to be used to access the data sequence for comparison against a short prefix of data of an uncompressed portion of the first compressed data block.

5. The apparatus of claim 4, wherein the data sequence is determined by decoding the compressed repeated instance of data.

6. The apparatus of claim 4, wherein the data sequence is obtained from an input data set without decoding the compressed repeated instance of data by accessing the input data set at a location corresponding to the location of the compressed repeated instance of data.

7. The apparatus of claim 1, wherein the first length is one byte greater than the second length.

8. The apparatus of claim 1, wherein the first length is four bytes and the second length is three bytes.

9. The apparatus of claim 1, wherein the first compression engine is a processor comprising at least one processor core.

10. The apparatus of claim 1, wherein the second compression engine is a hardware accelerator.

11. The apparatus of claim 1, wherein:
  a first hash table generated by the first compression engine is to include a maximum of a single location associated with each hash value of the first hash table; and
  a second hash table generated by the second compression engine is to include a plurality of locations associated with each of at least some of the hash values of the second hash table.

12. The apparatus of claim 1, wherein the first compression engine is further to instruct the second compression engine to generate the first compressed data block.

13. The apparatus of claim 1, further comprising the second compression engine.

14. The apparatus of claim 1, further comprising a battery communicatively coupled to the first compression engine, a display communicatively coupled to the first compression engine, or a network interface communicatively coupled to the first compression engine.

15. A method comprising:
  receiving, by a first compression engine, a first compressed data block from a second compression engine that is to generate the first compressed data block by compressing a first plurality of repeated instances of data that each have a length greater than or equal to a first length; and
  compressing, by the first compression engine, a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated.

16. The method of claim 15, wherein the first compression engine is a processor comprising at least one processor core and the second compression engine is a hardware accelerator.

17. The method of claim 15, further comprising identifying a repeated instance of data by:
  performing a hash function on a short prefix of data of the first compressed data block to generate a hash value, the short prefix of data having a size equal to the second length;
  identifying a location associated with the hash value; and
  determining that the short prefix of data matches data at the location associated with the hash value.

18. The method of claim 15, wherein the first length is one byte greater than the second length.

19. At least one non-transitory machine accessible storage medium having instructions stored thereon, the instructions when executed on a machine, to cause the machine to:
  receive, by a first compression engine, a first compressed data block from a second compression engine that is to generate the first compressed data block by compressing a first plurality of repeated instances of data that each have a length greater than or equal to a first length; and
  compress, by the first compression engine, a second plurality of repeated instances of data of the first compressed data block that each have a length greater than or equal to a second length, the second length being shorter than the first length, wherein each compressed repeated instance of the first and second pluralities of repeated instances comprises a location and length of a data instance that is repeated.

20. The at least one medium of claim 19, wherein the first compression engine is a hardware accelerator and the second compression engine is a processor comprising at least one processor core.

* * * * *